United States Patent [19]

Tada et al.

[11] Patent Number: 4,873,686
[45] Date of Patent: Oct. 10, 1989

[54] TEST ASSIST CIRCUIT FOR A SEMICONDUCTOR DEVICE PROVIDING FAULT ISOLATION

[75] Inventors: Tetsuo Tada; Tsuyoshi Yamada, both of Hyogo, Japan

[73] Assignee: Mitsubishi Denki Kabushiki Kaisha, Japan

[21] Appl. No.: 142,557

[22] Filed: Jan. 11, 1988

[30] Foreign Application Priority Data

Jan. 14, 1987 [JP] Japan ................................. 62-6982

[51] Int. Cl.$^4$ ............................................. G06F 11/00
[52] U.S. Cl. .................................. 371/22.4; 371/21.1
[58] Field of Search ....................... 371/21, 38, 24, 25, 371/15, 67, 2; 365/201

[56] References Cited

U.S. PATENT DOCUMENTS

| | | | |
|---|---|---|---|
| 4,631,724 | 12/1986 | Shimizu | 371/25 X |
| 4,667,330 | 5/1987 | Kumagai | 371/21 X |
| 4,672,582 | 6/1987 | Nishimura | 365/201 |
| 4,701,919 | 10/1987 | Naitoh | 371/21 |
| 4,726,023 | 2/1988 | Carter | 371/25 X |
| 4,730,320 | 3/1988 | Hidaka | 371/21 X |

OTHER PUBLICATIONS

*IEEE 1986 Custom Integrated Circuits Conference,* "Advanced Testing Techniques for Structured Asic Products", by Rick Rasmussen et al., 1986, pp. 412–415.

Primary Examiner—Jerry Smith
Assistant Examiner—Robert W. Beausoliel
Attorney, Agent, or Firm—Lowe, Price, LeBlanc & Shur

[57] ABSTRACT

In a test assist circuit for a semiconductor device, an address input selector (14a) is so switched that an external address signal is supplied to an address decoder (4) to address a memory circuit (3), while an input data selector (14b) is so switched that external input data is stored in an input data register (5), to be stored in addressed memory elements. Information of the most significant bit of the input data register is stored in an input data information storage area (16), and information of the least significant bit of the address decoder is stored in an address decoder information storage area (15). Data read from the memory circuit is stored in an output data register (6), to be outputted to a data output terminal (9) with the information stored in the address decoder information storage area and that stored in the input data information storage area respectively. Thus, the input data information and the address decoder information added to the outputted data are so observed that a determination can be easily made as to whether the memory circuit is in failure or the test assist circuit is in failure, even if the data read from the memory circuit is in failure.

12 Claims, 7 Drawing Sheets

TEST ASSIST CIRCUIT FOR A SEMICONDUCTOR DEVICE PROVIDING FAULT ISOLATION

BACKGROUND OF THE INVENTION

1. Field of the Invention

The present invention relates to a test assist circuit for a semiconductor device. More specifically, it relates to a test assist circuit for a semiconductor device, which is contained in a semiconductor device having a memory circuit for storing multiple-bit data and a logic circuit, for independently testing the memory circuit.

2. Description of the Prior Art

A well-known method of testing a memory assembled in a semiconductor device is disclosed in "Advanced Testing Techniques for Structured ASIC Products" reported by Rick Rasmussen, Yen Chang and Fred White, IEEE 1986, Custom Integrated Circuits Conference. In this method, registers are provided in correspondence to write data, address signals and read data respectively for testing a RAM contained in the semiconductor device, thereby to perform a test for accessing the RAM with a small number of external pins.

Figure 1:
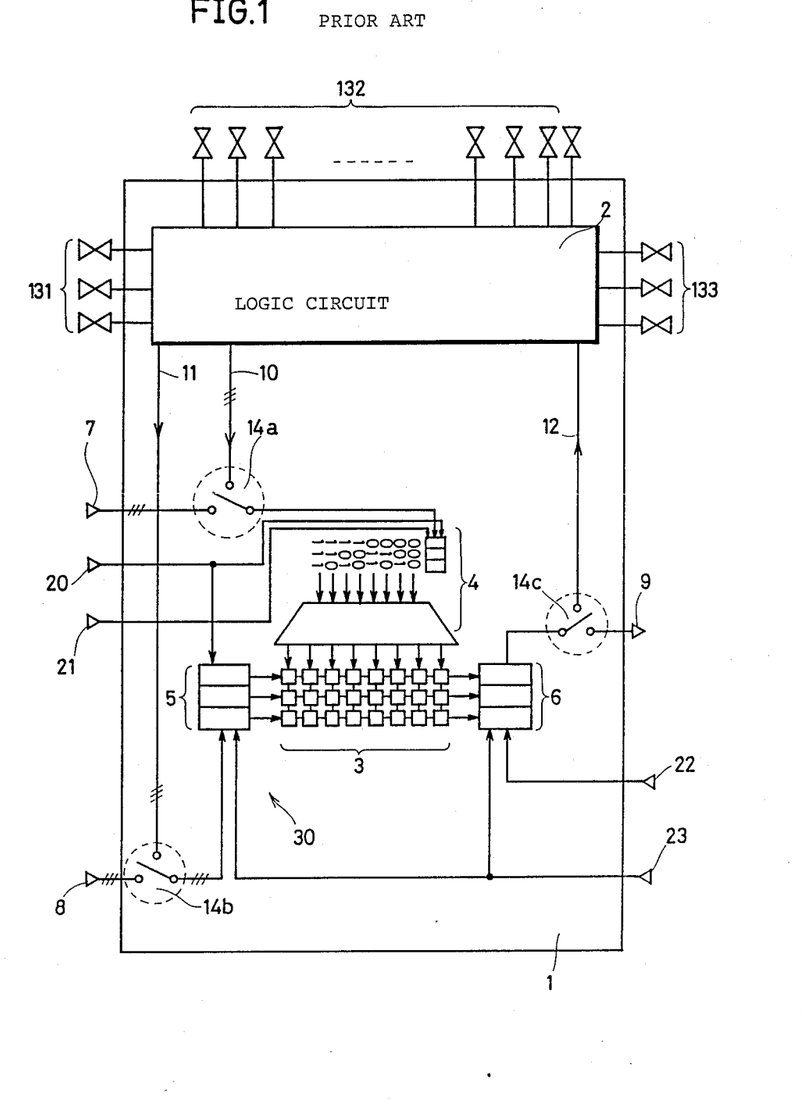
FIG. 1 illustrates a conventional test assist circuit for a semiconductor device.
Figure 2:
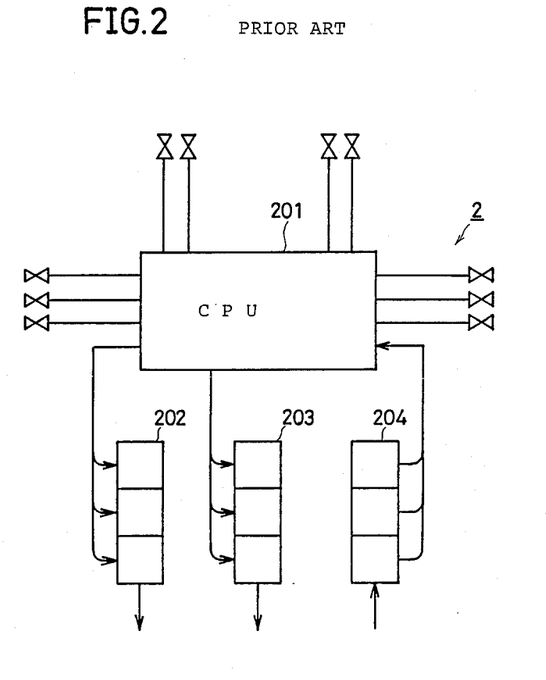
FIG. 2 is a block diagram showing an example of a logic circuit as shown in FIG. 1.

FIGS. 1 and 2 are illustrative of a conventional test assist circuit for testing a memory circuit. Referring to FIG. 1, a semiconductor device 1 is provided with a logic circuit 2, a memory circuit 3, an address decoder 4, an input data register 5 and an output data register 6. As shown in FIG. 2, the logic circuit 2 includes a CPU 201, an output data register 202, an address register 203 and an input data register 204, such that the CPU 201 outputs internal data through the output data register 202 and an internal address signal through the address register 203. The input data register 204 is adapted to supply data read from the memory circuit 3 to the CPU 201. The memory circuit 3 has memory of 3 bits by 8 words, for example.

The semiconductor device 1 is further provided with an address input terminal 7, a data input terminal 8, a data output terminal 9, data shift clock terminals 20 and 22, a latch clock terminal 21 and an input/output data latch clock terminal 23. The address input terminal 7 receives a bit-serial address signal of three bits, for example. The data input terminal 8 is externally supplied with bit-serial input data of three bits, for example. The data output terminal 9 is adapted to output bit-serial data to the exterior. The data shift clock terminal 20 is supplied with a data shift clock signal for shifting the address signal received in the address input terminal 7 and storing the same in the address decoder 4 as well as shifting the input data received through the data input terminal 8 and storing the same in the input data register 5.

The latch clock terminal 21 is supplied with a latch clock signal for supplying the address signal stored in the address decoder 4 to the memory circuit 3. The data shift clock terminal 22 receives a data shift clock signal for sequentially shifting data of the output data register 6, which stores output from the memory circuit 3, to the data output terminal 9. The input/output data latch clock terminal 23 is supplied with an input/output data latch clock signal for writing the input data stored in the input data register 5 into the memory circuit 3 and storing the data read from the memory circuit 3 in the output data register 6.

The internal address signal outputted from the address register 203 of the logic circuit 2 and the external address signal received in the address input terminal 7 are switched by an address input selector 14a, to be supplied to the address decoder 4. The internal data outputted from the output data register 202 of the logic circuit 2 and the external input data received in the data input terminal 8 are switched by input data selector 14b to be supplied to the input data register 5. Further, the data outputted from the output data register 6 is switched by an output data selector 14c, to be supplied to either the data output terminal 9 or the input data register 204 of the logic circuit 2.

With reference to FIGS. 1 and 2, description is now made on operation for writing/reading data in/from the memory circuit 3. In order to write data in the memory circuit 3 through operation of the logic circuit 2, the address input selector 14a, the input data selector 14b and the output data selector 14c are switched toward the logic circuit 2 respectively. The address register 203 of the logic circuit 2 outputs an internal address signal, which in turn is supplied to the address decoder 4 through the address input selector 14a. This address signal is formed by three bits, for example, to be capable of addressing of $2^3 = 8$ combinations. Vertical memory elements of the memory circuit 3 are addressed by this address signal.

The output data register 202 of the logic circuit 2 outputs three-bit internal data in a bit-serial manner, which internal data is supplied to the input data register 5 through the input data selector 14b. Then an input/output data latch clock signal is supplied to the input/output data latch clock terminal 23 and a data shift clock signal is supplied to the data shift clock terminal 20, whereby the input/output data register 5 stores the internal data so that the three-bit internal data is outputted to the memory circuit 3 in a bit-serial manner, to be written in the addressed memory elements.

In order to read data from the memory circuit 3, the address decoder 4 addresses arbitrary memory elements similarly to the case of write operation, so that data is read from the memory elements to be supplied to the output data register 6. The output data register 6 latches the data read from the memory elements on the basis of an input data latch clock signal received in the input/output data latch clock terminal 23. Then a data shift clock signal is supplied to the data shift clock terminal 22, so that the output data register 6 sequentially reads the latched data in a bit-serial manner. The data is supplied to the input data register 204 of the logic circuit 2 through the output data selector 14c.

Description is now made on test operation for the memory circuit 3. In order to test the memory circuit 3, the address input selector 14a is switched toward the address input terminal 7 and the input data selector 14b is switched toward the data input terminal 8, while the output data selector 14c is switched toward the data output terminal 9. An address signal is externally inputted in the address input terminal 7, to be supplied to the address decoder 4 through the address input selector 14a. Input data is externally supplied to the data input terminal 8, to be supplied to the input data register 5 through the input data selector 14b. A data shift clock signal is supplied to the data shift clock terminal 20, so that the address signal is stored in the address decoder 4 and the input data is stored in the input data register 5 on the basis of the data shift clock signal. The address decoder 4 addresses arbitrary memory elements, so that the input data, being stored in the input data register 5, is stored in the addressed memory elements.

Then, the address decoder 4 addresses arbitrary memory elements of the memory circuit 3 similarly to the case of write operation, so that data is read from the memory elements to be supplied to the output data register 6. An input/output data latch clock signal is supplied to the output data register 6, so that the data read from the memory elements is latched by the output data register 6. Then a data shift clock signal is supplied to the output data register 6, so that bit-serial data is outputted from the output data register 6, to be outputted to the data output terminal 9 through the output data selector 14c. Thus, a test can be made as to whether or not the data is correctly written and read by judging whether or not the outputted data is in coincidence with the data supplied to the data input terminal 8.

In the conventional semiconductor device 1 as hereinabove described, the address input selector 14a, the input data selector 14b and the output data selector 14c are switched toward the terminals 7, 8 and 9 respectively while addressing the memory circuit 3, thereby to test whether or not input data is normally written/read in/from respective memory elements. However, if the data is not normally written in or read from the memory circuit 3, it is impossible to judge whether the memory circuit 3 itself is in failure or a test assist circuit 30, being formed by the address decoder 4, the input data register 5 and the output data register 6, is in failure. Even if the memory circuit 3 is normal, correct data cannot be read in the memory circuit 3 when a single-bit area in the input data register 5 is in failure, as a matter of course. Further, if the address decoder 4 is in failure, the target memory elements cannot be addressed and hence the data cannot be correctly written in the same. In the conventional test assist circuit 30, therefore, a great deal of effort and time are required to analyze the cause of abnormal data reading or writing.

SUMMARY OF THE INVENTION

Accordingly, a principal object of the present invention is to provide a test assist circuit for a semiconductor device, which can easily test if a memory circuit itself is in failure, addressing means for addressing memory elements is in failure or storage means for storing input data is in failure.

Briefly stated, the present invention is adapted to store multiple-bit data outputted from a memory circuit while storing either at least single-bit information within a multiple-bit address signal outputted from addressing means or at least single-bit information within multiple-bit input data stored in input data storage means, to output the information with the multiple-bit data read from the memory circuit.

Thus, according to the present invention, either at least single-bit information within the address signal or at least single-bit information within the input data is outputted with the data read from the memory circuit, and hence, even if the data read from the memory circuit is in failure, a determination can be easily made as to whether the memory circuit is in failure or the test assist circuit is in failure by observing the single-bit information of the address signal or the input data.

In a preferred embodiment of the present invention, either an internal address signal outputted from a logic circuit or an externally supplied address signal is selected to be supplied to addressing means, while either internal data outputted from the logic circuit or externally supplied input data is selected to be supplied to input data storage means.

Thus, according to the preferred embodiment of the present invention, respective ones of address selecting means and input data selecting means are switched toward input terminals to externally supply the address signal and the input data, thereby to easily test a memory circuit.

In a more preferred embodiment of the present invention, output data selecting means, which is adapted to supply output of output data storage means to either a logic circuit or an external terminal, is switched toward the external terminal to easily output data of the test result.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
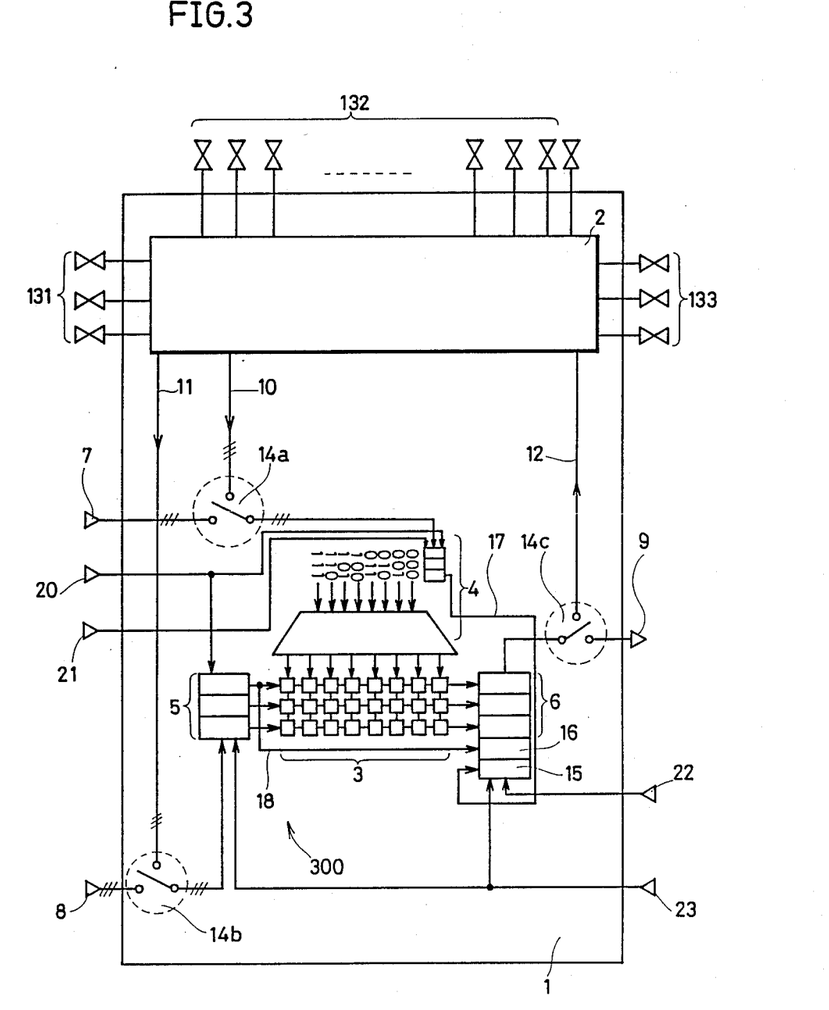
FIG. 3 is a block diagram showing an embodiment of the present invention.

FIG. 3 is a block diagram showing an embodiment of the present invention.

Referring to FIG. 3, description is now made of the structure of this embodiment, which is similar to that shown in FIG. 1 except for the following points:

In relation to an output data register 6, an address decoder information storage area 15 for storing information of the least significant bit of an address decoder 4 and an input data information storage area 16 for storing information recorded in the upper stage of an input data register 5 are provided.

Figure 4:
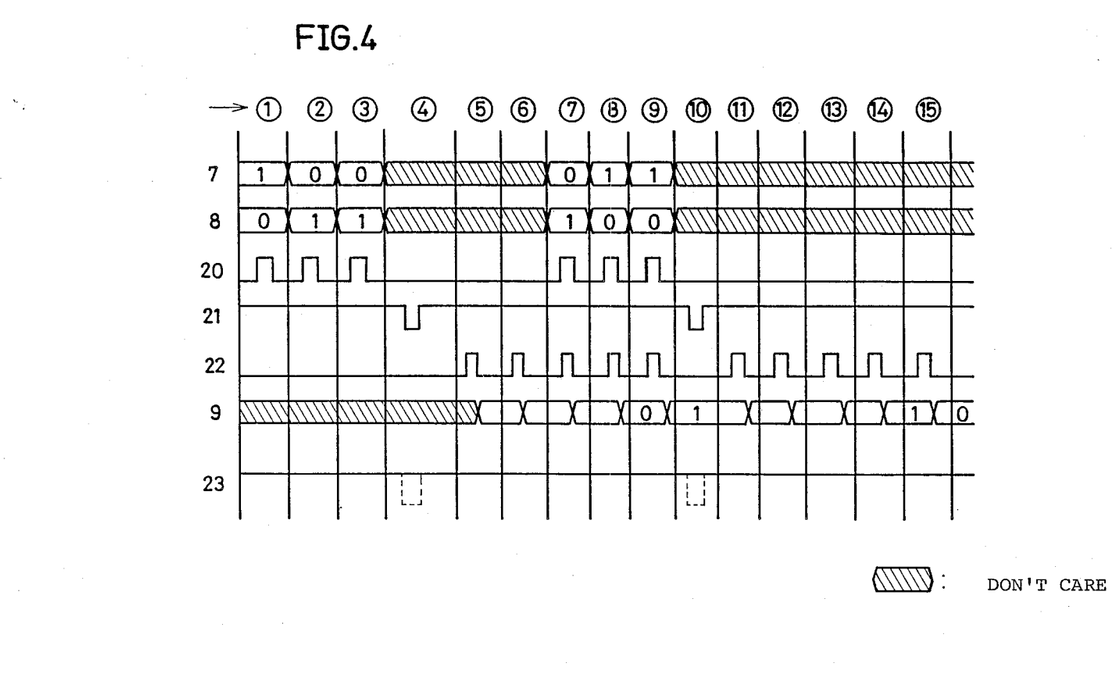
FIG. 4 is a timing chart showing operation for confirming the function of a test assist circuit according to the embodiment of the present invention.
Figure 5:
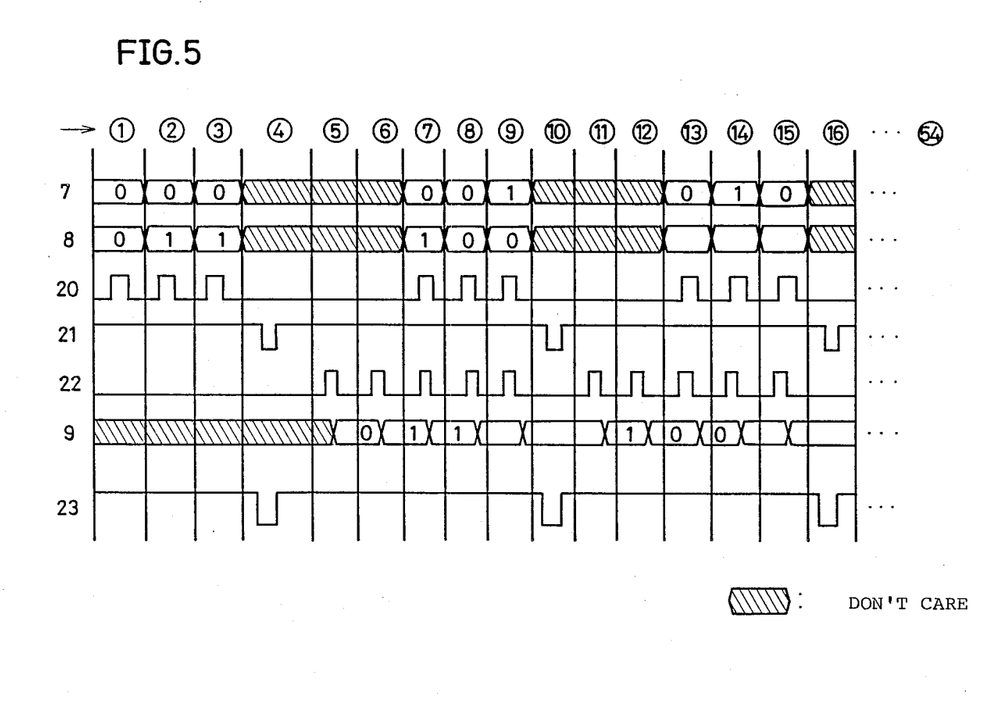
FIG. 5 is a timing chart showing operation for confirming the function of a memory circuit in the embodiment of the present invention.
Figure 6:
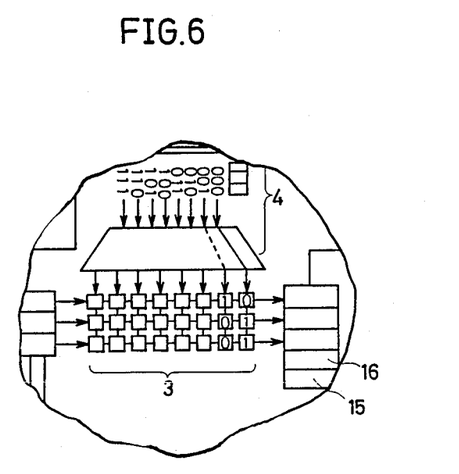
FIG. 6 is illustrative of the status of data written in the memory circuit.

FIG. 4 is a timing chart for illustrating operation for confirming the function of a test assist circuit according to the embodiment of the present invention, FIG. is a timing chart for illustrating operation for confirming the function of a memory circuit, and FIG. 6 illustrates the status of data written in the memory circuit.

Referring to FIGS. 3 to 6, description is now made on the operation of this embodiment. First, an address input selector 14a, an input data selector 14b and an output data selector 14c are switched toward terminals 7, 8 and 9 respectively. Then the address input terminal 7 is supplied with an address signal of "1, 0, 0" and the data input terminal 8 is supplied with data of "0, 1, 1" while three shift clock signals are simultaneously supplied from the data shift clock terminal 20. The address signal "1, 0, 0" s stored in the address decoder 4 and the input data "0, 1, 1" is stored in the input data register 5 on the basis of the shift clock signals. Such status is shown in cycles ① to ③ in FIG. 4. At this time, information of the least significant bit of the address decoder 4 is "1".

In a cycle ④ as shown in FIG. 4, a low-level latch clock signal is supplied to the latch clock terminal 21 so that the address signal stored in the address decoder 4 is supplied to the memory circuit 3 on the basis of the latch clock signal, thereby to address specific memory elements in the memory circuit 3. Thus, data is read from the corresponding memory elements to be supplied to the output data register 6. At this time, the first-inputted information "0" within the data stored in the input data register 5 and the address information "1" of the least significant bit outputted from the address decoder 4 are stored in the input data information storage area 16 and the address decoder information storage area 15 respectively.

Then, the data shift clock terminal 22 supplies five clock signals, for example, to the output data register 6, the input data information storage area 16 and the address decoder information storage area 15, so that the data stored in the output data register 6, the address decoder information storage area 15 and the input data information storage area 16 respectively are sequentially outputted to the data output terminal 9 as shown in cycles ⑤ to ⑨.

Three output values in the cycles ⑤ to ⑦ are output data read from the memory circuit 3, while information outputted from the input data information storage area 16 appears in the cycle ⑧ and information outputted from the address decoder information storage area 15 appears in the cycle ⑨ respectively. In this example, information "0" is outputted in the cycle ⑧ and information "1" appears in the cycle ⑨, while information "0" appearing from the cycle 8 is held until the cycle ⑨. The held information is continuous up to a period in which the data shift clock terminal 22 outputs subsequent data shift clock signals. The information "1" appearing in the cycle ⑨ is similarly held unitl a cycle ⑪ in which the data shift clock terminal 22 outputs the data shift clock signals.

In the cycles ⑦, ⑧ and ⑨, an address signal of "0, 1, 1" is supplied from the address input terminal 7 and input data of "1, 0, 0" is supplied from the data input terminal 8 respectively in synchronization with the data shift clock signals. These cycles ⑦, ⑧, ⑨ and ⑩ are similar to the aforementioned cycles ①, ②, ③ and ④, except for that the data are different. Further, cycles ⑪, ⑫, ⑬, ⑭ and ⑮ are identical to the aforementioned cycles ⑤, ⑥, ⑦, ⑧ and ⑨. Data "1" appears at the data output terminal 9 in the cycle ⑭, while data "0" appears in the cycle ⑮. This is because the data input in the cycle ⑦ is reversed to that inputted in the cycle ①.

During the interval of the cycles ① to ⑮, the input/output data latch clock terminal 23 must be regularly maintained at a high level in order to inhibit data writing in the memory circuit 3. Thus, functional operation of the test assist circuit 300 can be independently confirmed in advance to the test for the memory circuit 3. In more concrete terms, such confirmation can be performed by connecting a testing set to the semiconductor device 1 and comparing data outputted from the data output terminal 9 with a predetermined expected value.

On the other hand, when input/output data latch clock signals are so supplied that the input/output data latch clock terminal 23 is not maintained at a high level but goes low in cycles ④ and ⑩ as shown in FIG. 5, data supplied from the data input terminal 8 in the memory circuit 3 are written in prescribed memory elements of the memory circuit 3 addressed by address signals supplied to the address input terminal 7. Such operation of the so-called write function is now described with reference to FIG. 5.

Operation in cycles ① to ③ is identical to that as hereinabove described with reference to FIG. 4, In a cycle ④, an input/output data latch clock signal is supplied from the input/output data latch clock terminal 23, so that an address signal of "0, 0, 0", being inputted through the address input terminal 7, addresses memory elements as shown by arrows in FIG. 6. Then, data "0, 1, 1" inputted from the data input terminal 8 to be written in the memory circuit 3 is written in the addressed memory elements. FIG. 6 shows such status.

Operation in cycles ⑤ to ⑨ is similar to that described above with reference to FIG. 4. Namely, the data "0", "1" and "1" written in the memory circuit 3 appear at the data output terminal 9 in the cycles ⑤, ⑥ and ⑦. In cycles ⑨ and ⑩, data of the input data information storage area 16 and the address decoder information storage area 15 are outputted respectively. In cycles ⑦, ⑧ and ⑨, an address signal of "0, 0, 1", which is different from that in the cycles ①, ② and ③, and data "1, 0, 0" to be written in the memory circuit 3 are simultaneously supplied so that a write operation is executed in a cycle ⑩.

In cycles ⑪, ⑫ and ⑬, the data "1, 0 0" written in memory elements 0, 0 and 1 as shown by arrows in FIG. 6 is outputted toward the data output terminal 9. Cycles ⑭ and ⑮ are identical to the cycles ⑨ and ⑩.

In cycles ⑬, ⑭ and ⑮, address data of "0, 1, 0" for the memory circuit 3 is counted up sequentially from the least significant bit. Data are thus supplied up to "1, 1, 1", so that the data inputted from the data input terminal 8 can be written/read in/from all of the memory elements of the memory circuit 3. 54 cycles are required in this embodiment.

According to the embodiment as hereinabove described, the test assist circuit 300 is disconnected from the logic circuit to be directly controlled from the terminals 7, 8 and 9 while single-bit information of the input data register 5 and single-bit information within the address signal are stored in the input data information storage area 16 and the address decoder information storage area 15 respectively to be outputted with the data read from the memory circuit 3. Thus, the single-bit information within the outputted input data and the single-bit information within the address signal are observed to easily determine whether the test assist circuit 300 is in failure or the memory circuit 3 is in failure.

Figure 7:
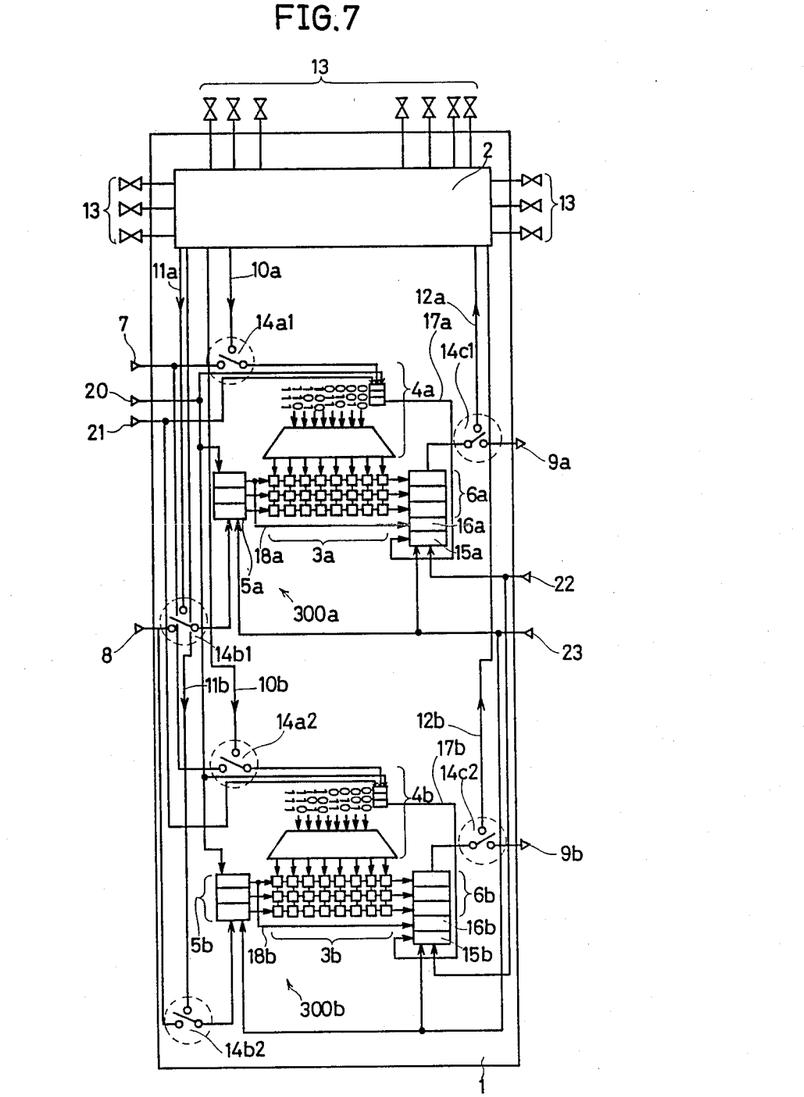
FIG. 7 is a block diagram showing another embodiment of the present invention.

FIG. 7 is a block diagram showing another embodiment of the present invention. The embodiment as shown in FIG. 7 is provided with two memory circuits 3a and 3b and two test assist circuits 300a and 300b, so that the respective memory circuits 3a and 3b and test assist circuits 300a and 300b can be independently tested. In correspondence to the respective memory circuits 3a and 3b, provided are address decoders 4a and 4b, input data registers 5a and 5b, output data registers 6a and 6b, input data information storage areas 16a and 16b, address decoder information storage areas 15a and 15b, address input selectors 14a1 and 14a2, input data selectors 14b1 and 14b2, output data selectors 14c1 and 14c2 and data output terminals 9a and 9b. A logic circuit 2 is adapted to output internal address signals and internal input data and receive internal output data in correspondence to respective ones of the memory circuits 3a and 3b. However, external address signals supplied to an address input terminal 7 and external input data supplied to an input data terminal 8 are common to the two memory circuits 3a and 3b.

Operation of the embodiment as shown in FIG. 7 is identical to that of the embodiment as shown in FIG. 3. However, data can be simultaneously written in the two memory circuits 3a and 3b, and tests therefor can be performed in the short time which is required for a single memory circuit. Further, reading of data written in the test assist circuits 300a and 300b and the memory circuits 3a and 3b can be observed by data output terminals 9a and 9b, which are independent of each other, to easily determine whether the memory circuits 3a and 3b are in failure or the test assist circuits 300a and 300b are in failure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test assist circuit for a semiconductor device, said test circuit being contained in a semiconductor device having a memory circuit for storing multiple-bit data, a logic circuit and selection means for disconnecting said test assist circuit from said logic circuit and connecting said test assist circuit to external terminals, for independently testing said memory circuit, said test assist circuit comprising:
addressing means for addressing said memory circuit on the basis of a multiple-bit address signal;
input data storage means for storing multiple-bit input data and supplying the same to said memory circuit; and
output data storage means for storing multiple-bit data outputted from said memory circuit including means for storing at least one of at least single-bit information within said multiple-bit address signal and at least single-bit information within said multiple-bit input data to output the same with said multiple-bit data outputted form said memory circuit.

2. A test assist circuit for a semiconductor device in accordance with claim 1, wherein
said logic circuit includes means for outputting a multiple-bit internal address signal and multiple-bit internal data,
said test assist circuit further including:
an address signal input terminal for receiving a multiple-bit external address signal;
a data input terminal for receiving multiple-bit external data; and wherein said selection means includes
address selecting means for selecting at least one of said external address signal received at said address signal input terminal and said internal address signal outputted from said logic circuit to supply the same to said addressing means; and
input data selecting means for selecting at least one of said external data received at said data input terminal and said internal data outputted from said logic circuit to supply the same to said input data storage means.

3. A test assist circuit for a semiconductor device in accordance with claim 2, wherein
said logic circuit includes means for receiving data outputted from said output data storage means,
said test assist circuit further including:
a data output terminal for outputting said data outputted from said output data storage means to the exterior; and wherein said selection means further includes
output signal selecting means for selectively outputting said data outputted from said output data storage means to at least one of said logic circuit and said data output terminal 4. A test assist circuit for a semiconductor device in accordance with claim 3, wherein
said output data storage means includes a register for storing said multiple-bit data, at least single-bit information within said address signal and at least single-bit information within said input data in a bit-parallel manner and outputting the same in a bit-serial manner.

5. A test assist circuit for a semiconductor device in accordance with claim 2, wherein
said data output means of said logic circuit includes means for outputting bit-serial data,
said data input terminal includes a terminal for receiving external bit-serial data, and
said input data storage means includes a register for storing said data selected by said input data selecting means in a bit-serial manner and outputting the same in a bit-parallel manner to supply the same to said memory circuit.

6. A test assist circuit for a semiconductor device in accordance with claim 2, including a plurality of said memory circuits,
said addressing means, said input data storage means, said address selecting means and said output data selecting means being provided in plural respecitvely in correspondence to said memory circuits.

7. In a test assist circuit for a semi-conductor device, said test assist circuit being contained in said semi-conductor device, said semi-conductor device having a memory circuit for storing multi-bit data and a logic circuit for independently testing said memory circuit, disconnecting means for disconnecting said memory circuit form said logic circuit, addressing means for addressing said memory circuit on the basis of a multiple-bit address signal, input data storage means for storing multiple-bit input data and supplying the same to said memory circuit, and output data storage means for storing multiple-bit data outputting from said memory circuit,
the improvement wherein,
said output data storage means further includes,
means for storing at least one of at least single-bit information within said multiple-bit address signal and at least single-bit information contained within said multiple-bit input data, and
means for controlling said output data storage means such that,
said at least one of (a) said at least single-bit information contained within said multiple-bit address signal and (b) said at least single-bit information contained within said multiple-bit input data is outputted with said multiple-bit data outputted from said memory circuit.

8. In a test assist circuit as recited in claim 7, wherein said logic circuit includes means for outputting a multiple-bit internal address signal and multiple-bit internal data, the improvement further comprising:

an address signal input terminal for receiving a multiple-bit external address signal;

a data input terminal for receiving multiple-bit external data; and wherein said disconnecting means includes address selecting means for selecting at least one of said external address signal received at said address signal input terminal and said internal address signal outputted from said logic circuit to supply the same to said addressing means; and input data selecting means for selecting at least one of said external data received at said data input terminal and said internal data outputted from said logical circuit to supply the same to said input data storage means.

9. In a test assist circuit as recited in claim 7, wherein said logic circuit further includes means for receiving data outputted from said output data storage means, the improvement further comprising: a data output terminal for outputting said data outputted from said output data storage means to the exterior; and wherein said disconnecting means further includes output signal selecting means for selectively outputting said data outputted from said output data storage means to at least one of said logic circuit and said data output terminal.

10. In a test assist circuit as recited in claim 9, the improvement further comprising said output data storage means including a register for storing said multiple-bit data, at least single-bit information within said address signal and at least single-bit information within said input data in a bit-parallel manner and outputting the same in a bit-serial manner.

11. In a test assist circuit as recited in claim 8, the improvement further comprising said data output means of said logic circuit further including means for outputting bit-serial data, said data input terminal including a terminal for receiving external bit-serial data, and said input data storage means including a register for storing said data selected by said input data selecting means in a bit-serial manner and outputting the same in a bit-parallel manner to supply the same to said memory circuit.

12. In a test assist circuit as recited in claim 7, wherein a plurality of said memory circuits are provided, the improvement further comprising said addressing means, said input data storage means, said addressing selecting means, and said output data selecting means being provided in a like plurality to said memory circuit and in correspondence with respective ones of said memory circuits.

* * * * *